US010620657B2

(12) United States Patent
Huang

(10) Patent No.: US 10,620,657 B2
(45) Date of Patent: Apr. 14, 2020

(54) CURRENT SOURCE CIRCUIT PROVIDING BIAS CURRENT UNRELATED TO TEMPERATURE

(71) Applicant: Nuvoton Technology Corporation, Hsinchu (TW)

(72) Inventor: Ming-Hsin Huang, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 15/818,754

(22) Filed: Nov. 21, 2017

(65) Prior Publication Data
US 2018/0143660 A1    May 24, 2018

(30) Foreign Application Priority Data

Nov. 21, 2016   (TW) .............................. 105138030 A

(51) Int. Cl.
*G05F 3/26* (2006.01)
*H02M 3/335* (2006.01)
*H03K 19/21* (2006.01)

(52) U.S. Cl.
CPC ............ *G05F 3/267* (2013.01); *H02M 3/335* (2013.01); *H03K 19/21* (2013.01)

(58) Field of Classification Search
CPC ....................................................... G05F 3/26
See application file for complete search history.

(56) References Cited

U.S. PATENT DOCUMENTS

| 5,293,112 A | * | 3/1994 | Takahashi | ............... G05F 3/227 323/312 |
| 5,349,286 A | * | 9/1994 | Marshall | ................... G05F 3/30 323/313 |
| 7,821,307 B2 | | 10/2010 | Chellappa | |

(Continued)

FOREIGN PATENT DOCUMENTS

| CN | 101995899 | 3/2011 |
| TW | 472901 | 1/2002 |

(Continued)

OTHER PUBLICATIONS

"Office Action of Taiwan Counterpart Application", dated Feb. 3, 2017, p. 1-p. 3.

(Continued)

*Primary Examiner* — Kyle J Moody
*Assistant Examiner* — Trinh Q Dang
(74) *Attorney, Agent, or Firm* — JCIPRNET

(57) ABSTRACT

A current source circuit includes a first current mirror, a first bipolar junction transistor (BJT), a second BJT, a third BJT and a first resistor. The first current minor has a first input terminal receiving a first current and a first output terminal providing a second current. The first BJT has a first collector coupled to the first output terminal, a first base, and a first emitter coupled to a reference voltage. The second BJT has a second collector coupled to the first input terminal, a second base coupled to the first base, and a second emitter. The first resistor is coupled between the second emitter and the reference voltage. The third BJT has a third collector providing a third current, a third base coupled to the first output terminal, and a third emitter coupled to the first base.

12 Claims, 5 Drawing Sheets

(56) References Cited

U.S. PATENT DOCUMENTS

| | | |
|---|---|---|
| 7,915,882 B2 | 3/2011 | Hellums |
| 2005/0083030 A1* | 4/2005 | Ito .............................. G05F 3/30 |
| | | 323/315 |
| 2007/0052405 A1* | 3/2007 | Mochizuki ................ G05F 3/30 |
| | | 323/316 |
| 2008/0048634 A1* | 2/2008 | Kotchkine .............. G05F 3/267 |
| | | 323/313 |
| 2015/0002130 A1 | 1/2015 | Kumar et al. |
| 2015/0276474 A1* | 10/2015 | Okada .................... H03K 17/78 |
| | | 250/214 A |
| 2017/0131736 A1* | 5/2017 | Acar ....................... H02M 1/36 |

FOREIGN PATENT DOCUMENTS

| | | |
|---|---|---|
| TW | 200827978 | 7/2008 |
| TW | 200845570 | 11/2008 |
| TW | 200925823 | 6/2009 |
| TW | 200944984 | 11/2009 |

OTHER PUBLICATIONS

"Office Action of China Counterpart Application," dated Jun. 13, 2019, p. 1-p. 7.

* cited by examiner

CURRENT SOURCE CIRCUIT PROVIDING BIAS CURRENT UNRELATED TO TEMPERATURE

CROSS-REFERENCE TO RELATED APPLICATION

This application claims the priority benefit of Taiwan application serial no. 105138030, filed on Nov. 21, 2016. The entirety of the above-mentioned patent application is hereby incorporated by reference herein and made a part of this specification.

BACKGROUND OF THE INVENTION

Field of the Invention

The invention relates to a power circuit, and more particularly to a current source circuit.

Description of Related Art

In design of an analog circuit, a reference voltage or reference current is required. The reference voltage provides an operation criterion, and the analog circuit is, for example, an oscillator, a delay cell, or the like. Moreover, depending on the process, characteristics of the analog circuit may drop, and the design of the analog circuit is affected. In addition, as the process evolves, the number of transistors contained in a unit area becomes increasingly larger, such that an increasingly larger amount of thermal energy is generated during operation of the circuit, and thus the temperature of the circuit becomes increasingly higher. Due to the temperature rise, characteristics of devices in the integrated circuit may deteriorate to cause instability of the performance of the circuit. Therefore, if a bias current which is stable and not affected by temperature is employed in the analog circuit, the difficulty in designing the circuit may be reduced.

SUMMARY OF THE INVENTION

The invention provides a current source circuit which provides a bias current unrelated to temperature.

The current source circuit of the invention includes a first current mirror, a first bipolar junction transistor (BJT), a second BJT, a third BJT and a first resistor. The first current mirror has a first input terminal receiving a first current and a first output terminal providing a second current, wherein a current value of the second current is the same as a current value of the first current. The first BJT has a first collector coupled to the first output terminal, a first base, and a first emitter coupled to a reference voltage. The second BJT has a second collector coupled to the first input terminal, a second base coupled to the first base, and a second emitter. The first resistor is coupled between the second emitter and the reference voltage. The third BJT has a third collector providing a third current, a third base coupled to the first output terminal, and a third emitter coupled to the first base, wherein the third current is configured to set a current value of a bias current of an analog circuit.

Based on the above, the current source circuit of embodiments of the invention mainly includes the first current mirror, the first BJT, the second BJT, the first resistor and the third BJT. Moreover, based on a positive temperature coefficient characteristic of gain values of the BJTs, a current source circuit having temperature compensation is formed. Accordingly, the current source circuit provides a bias current unrelated to temperature.

To make the above features and advantages of the invention more comprehensible, embodiments accompanied with drawings are described in detail as follows.

DETAILED DESCRIPTION OF DISCLOSED EMBODIMENTS

Figure 1A:
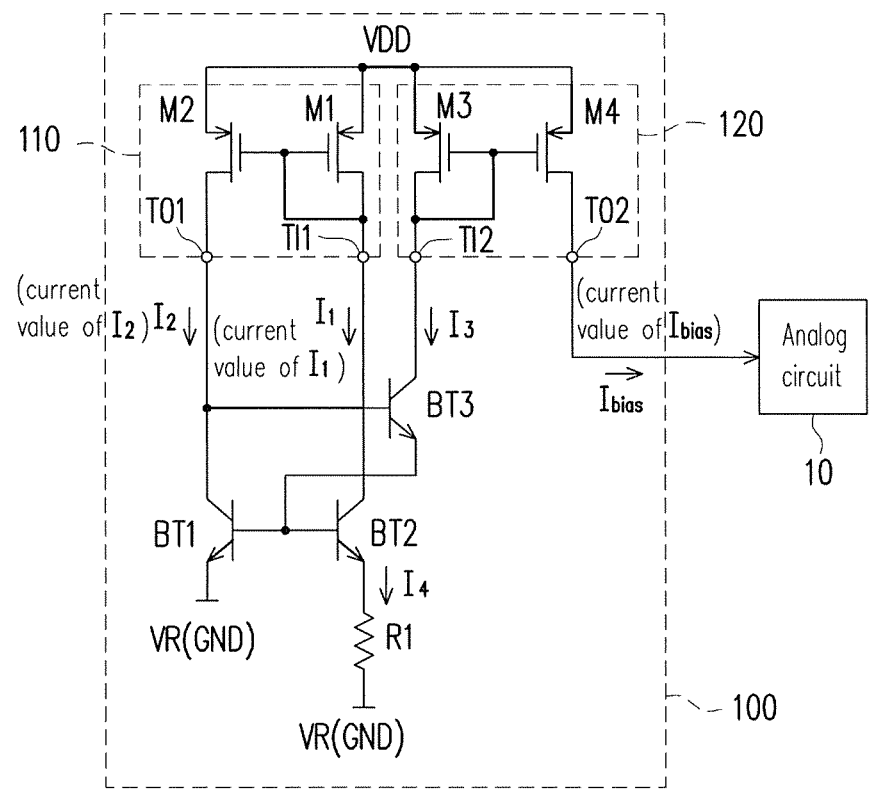
FIG. 1A is a schematic circuit diagram of a current source circuit according to an embodiment of the invention.

FIG. 1A is a schematic circuit diagram of a current source circuit according to an embodiment of the invention. Referring to FIG. 1A, in the present embodiment, a current source circuit 100 includes a first current mirror 110, a second current mirror 120, a first bipolar junction transistor (BJT) BT1, a second BJT BT2, a first resistor R1 and a third BJT BT3.

The first current mirror 110 has a first input terminal TI1 receiving a first current $I_1$, and a first output terminal TO1 providing a second current $I_2$, wherein a current value of the second current $I_2$ is the same as that of the first current $I_1$. The first BJT BT1 has a first collector coupled to the first output terminal TO1, a first base, and a first emitter coupled to a reference voltage VR, wherein the reference voltage VR is, for example, a grounding voltage GND. The second BJT BT2 has a second collector coupled to the first input terminal TI1, a second base coupled to the first base of the first BJT BT1, and a second emitter. The first resistor R1 is coupled between the second emitter of the second BJT BT2 and the reference voltage VR.

The third BJT BT3 has a third collector providing a third current $I_3$, a third base coupled to the first output terminal TO1, and a third emitter coupled to the first base of the first BJT BT1. The second current mirror 120 has a second input terminal TI2 receiving the third current $I_3$, and a second output terminal TO2 providing a bias current $I_{bias}$ to an analog circuit 10. Herein, by a mirroring function of the second current mirror 120, the third current $I_3$ is configured to set a current value of the bias current $I_{bias}$ received by the analog circuit 10. That is, the current value of the bias current $I_{bias}$ is the same as that of the third current $I_3$.

Based on the above, the invention is based on device characteristics of bipolar junction transistors (BJTs). By a simple current mirror structure, the current source circuit 100 is obtained having temperature compensation, so as to provide the bias current $I_{bias}$ to the analog circuit 10. Since a gain value β of the BJTs is a positive temperature coefficient (proportional to absolute temperature, PTAT), a fourth current $I_4$ flowing through the first resistor R1 is roughly directly proportional to temperature.

In detail, when a working temperature of the current source circuit 100 rises, a current value of the fourth current $I_4$ increases. Thus, a current flowing into the first base of the first BJT BT1 and the second base of the second BJT BT2 should increase to compensate for a shortage of current. When the working temperature of the current source circuit 100 falls, the current flowing into the first base of the first BJT BT1 and the second base of the second BJT BT2 should decrease, so as to control a stable operating point of the first current mirror 110, the first BJT BT1, the second BJT BT2 and the third BJT BT3.

Since a transistor gain value β is directly proportional to temperature, when the working temperature of the current source circuit 100 rises, the base current which was supposed to increase does not need to increase due to an increase in the gain values β of the first BJT BT1 and the second BJT BT2. By contrast, when the working temperature of the current source circuit 100 falls, while the gain value β of the first BJT BT1 and the second BJT BT2 is reduced, a current of the third collector of the third BJT BT3 increases so as to compensate for the lack of current in the first base of the first BJT BT1 and the second base of the second BJT BT2. Accordingly, after operation of the circuit becomes stable, a temperature compensation effect occurs in the current of the third collector of the third BJT BT3, and a current value curve appears flat. Next, the bias current $I_{bias}$ is mirrored by the second current mirror 120 to the analog circuit 10 for use.

In terms of circuit analysis, the first BJT BT1 and the second BJT BT2 have a ratio value n and form a voltage difference being a positive temperature coefficient. That is, the voltage difference $\Delta V_{BE(BT1-BT2)} = V_{BE1} - V_{BE2} = V^T \ln(n)$, wherein $V_{BE1}$ is a voltage difference between the first base and the first emitter of the first BJT BT1, $V_{BE2}$ is a voltage difference between the second base and the second emitter of the second BJT BT2, $V_T$ is a BJT thermal voltage, and n is a positive integer and its value depends on circuit design.

Due to the first current mirror 110, the current of the first collector of the first BJT BT1 is equal to the current of the second collector of the second BJT BT2, i.e., $I_{C1} = I_{C2} = \Delta V_{BE(BT1-BT2)}/R_1$, wherein $I_{C1}$ is the current of the first collector of the first BJT BT1, $I_{C2}$ is the current of the second collector of the second BJT BT2, and $R_1$ is a resistance value of the first resistor R1. The transistor gain value β and temperature can be defined as follows: $\beta = I_C/I_B = I_S/I_B * \exp(V_{BE}/V_T)$, wherein $I_C$ is a collector current of a BJT, $I_B$ is a base current of the BJT, $I_S$ is a saturation current of the BJT, and $V_{BE}$ is a voltage difference between the base and the emitter of the BJT.

Since the third collector of the third BJT BT3 is coupled to the first base of the first BJT BT1 and the second base of the second BJT BT2, and the current of the first collector of the first BJT BT1 is equal to the current of the second collector of the second BJT BT2, the current $I_{C3}$ of the third collector of the third BJT BT3 is defined as follows: $I_{C3} = I_{B1} + I_{B2} = 2I_{C2}/\beta = 2\Delta V_{BE(BT1-BT2)}/(\beta R_1) = 2V_T\ln(n)/(\beta R_1)$.

Based on the above, a temperature coefficient of the current source circuit 100 is related to the voltage difference $V_{BE}$ between the base and the emitter of the BJT. Therefore, the temperature coefficient can be canceled by adjusting the above parameter n.

In an embodiment of the invention, type of the first resistor R1 is positively related to, negatively related to or unrelated to temperature. In detail, since the first resistor $R_1$ having a negative temperature coefficient generates the fourth current $I_4$ having a higher positive temperature slope at a lower value of n, the first resistor $R_1$ having a negative temperature coefficient is better than the first resistor $R_1$ having a positive temperature coefficient. However, when the value n is sufficiently large so that the positive temperature coefficient of $\Delta V_{BE(BT1-BT2)}$ is greater than a positive temperature coefficient of the resistance value of the first resistor R1, the first resistor R1 may have a positive temperature coefficient.

Since the transistor gain value β is a process parameter and is obtained from silicon measurement data, it can be directly retrieved from a device model file. The transistor gain value β is defined as follows: $\beta_F(T) = \beta_{F0}(T/Tr)^{X_{TB}}$, wherein $\beta_F(T)$ is a forward gain value, $\beta_{F0}(T/Tr)$ is a function for calculating a nominal gain value, and $X_{TB}$ is a forward and reverse gain temperature index. In an embodiment of the invention, when $X_{TB} = 0.0001$ (i.e., 1e-4), the value n and the first resistor R1 need to be adjusted so as to optimize the temperature compensation. In fact, the value n may be set to 8, and that is, a saturation current ratio between the first BJT BT1 and the second BJT BT2 is approximately 1:8.

In the present embodiment, the first current mirror 110 includes a first metal oxide semiconductor (MOS) transistor M1 and a second MOS transistor M2. The first MOS transistor M1 has a source (corresponding to a first source/drain) receiving a system voltage VDD, a first gate, and a drain (corresponding to a second source/drain) coupled to the first gate and the first input terminal TI1. The second MOS transistor M2 has a source (corresponding to a third source/drain) receiving the system voltage VDD, a second gate coupled to the first gate of the first MOS transistor M1, and a drain (corresponding to a second source/drain) coupled to the first output terminal TO1.

In the present embodiment, the second current mirror 120 includes a third MOS transistor M3 and a fourth MOS transistor M4. The third MOS transistor M3 has a source (corresponding to a fifth source/drain) receiving the system voltage VDD, a third gate, and a drain (corresponding to a sixth source/drain) coupled to the third gate and the second input terminal TI2. The fourth MOS transistor M4 has a source (corresponding to a seventh source/drain) receiving the system voltage VDD, a fourth gate coupled to the third gate of the third MOS transistor M3, and a drain (corresponding to an eighth source/drain) coupled to the second output terminal TO2.

Figure 1B:
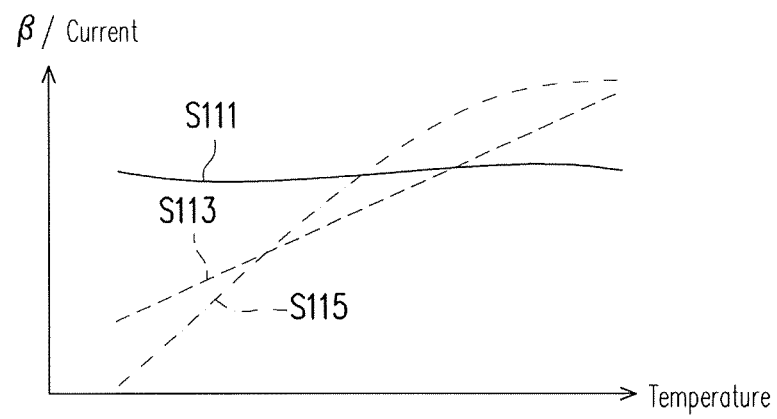
FIG. 1B is a schematic curve diagram of a bias current, a transistor gain value and a fourth current relative to temperature according to an embodiment of the invention.

FIG. 1B is a schematic curve diagram of a bias current, a transistor gain value and a fourth current relative to temperature according to an embodiment of the invention. Referring to FIG. 1A and FIG. 1B, in the present embodiment, curve S111 is a temperature curve of the bias current $I_{bias}$, curve S113 indicates a speed at which the fourth current $I_4$ increases with temperature, and curve S115 indicates a speed at which the gain value β of the second BJT BT2 increases with temperature. When the working temperature of the current source circuit 100 is higher, the speed at which the gain value β of the second BJT BT2 increases with temperature is higher than the speed at which the fourth current $I_4$ increases with temperature, and the current of the second base of the second BJT BT2 thus becomes smaller. When the working temperature of the current source circuit 100 is lower, the speed at which the gain value β of the second BJT BT2 increases with temperature is lower than the speed at which the fourth current $I_4$ increases with temperature, and the current of the second base of the second BJT BT2 thus becomes larger.

Referring to FIG. 1B, to flatten the curve of the bias current $I_{bias}$, curve S113 (i.e., the speed at which the fourth current $I_4$ increases with temperature) and curve 115 (i.e., the speed at which the gain value β of the second BJT BT2 increases with temperature) have an intersection point. Therefore, curve S113 has a lower slope than curve S115, i.e., the speed at which the fourth current $I_4$ flowing through the first resistor R1 increases with temperature is lower than the speed at which the gain value β of the second BJT BT2 increases with temperature.

Figure 1C:
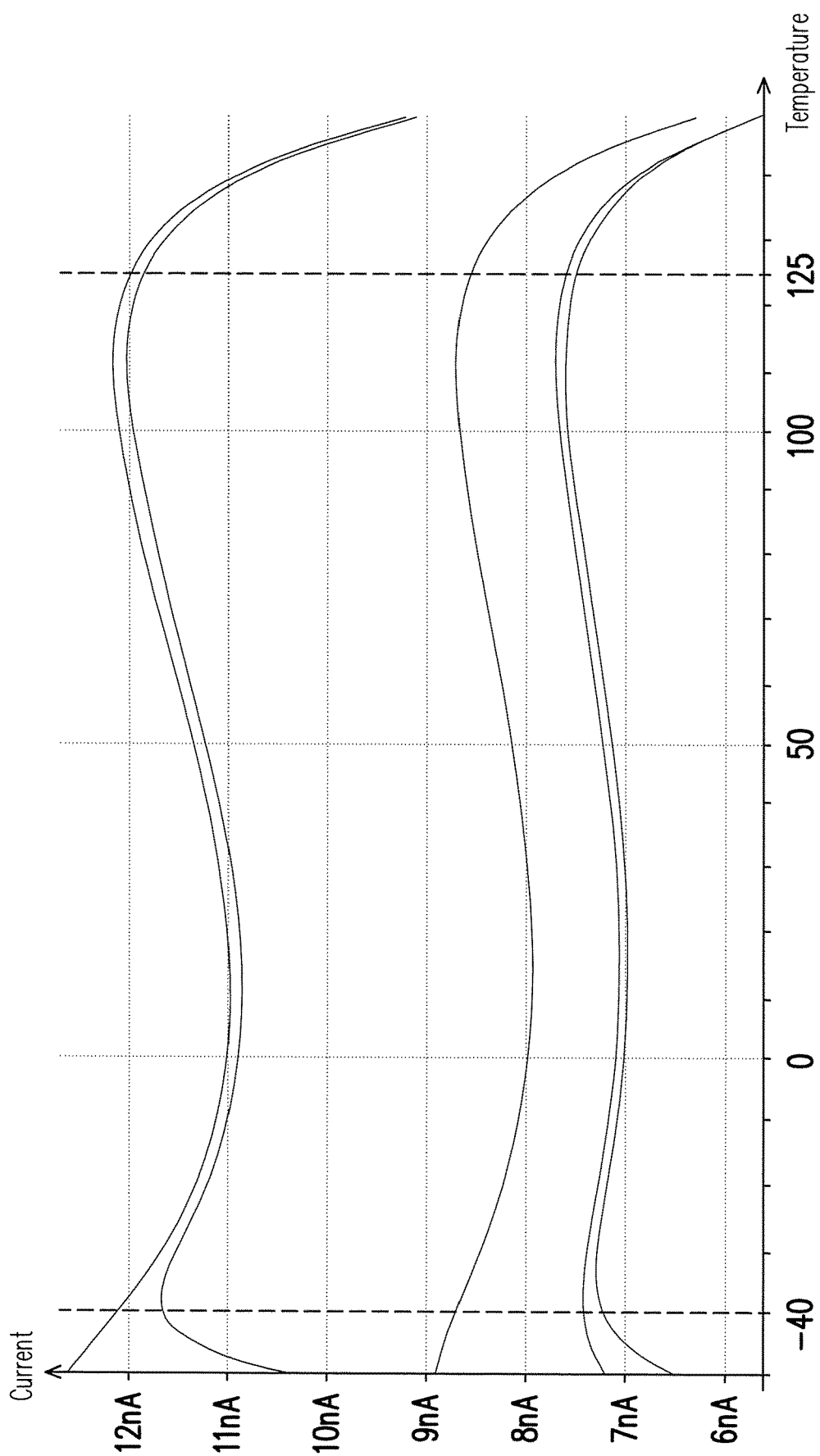
FIG. 1C is a schematic simulation diagram of a bias current relative to temperature under different process variables (TT, FF, SS, FS, and SF) according to an embodiment of the invention.

FIG. 1C is a schematic simulation diagram of a bias current relative to temperature under different process variables (TT, FF, SS, FS, and SF) according to an embodiment of the invention. Referring to FIG. 1A and FIG. 1C, in the present embodiment, the current values of the simulated bias current $I_{bias}$ are roughly 7.5 nA (nanoampere), 8.5 nA and 12 nA. Through circuit simulation, at a temperature between −40° C. and 125° C., the bias current $I_{bias}$ has a flat current waveform and has a current swing of roughly 1 nA, i.e., a 10% current swing. In the above, TT represents typical-typical, FF represents fast-fast, SS represents slow-slow, FS represents fast-slow, and SF represents slow-fast.

Figure 2A:
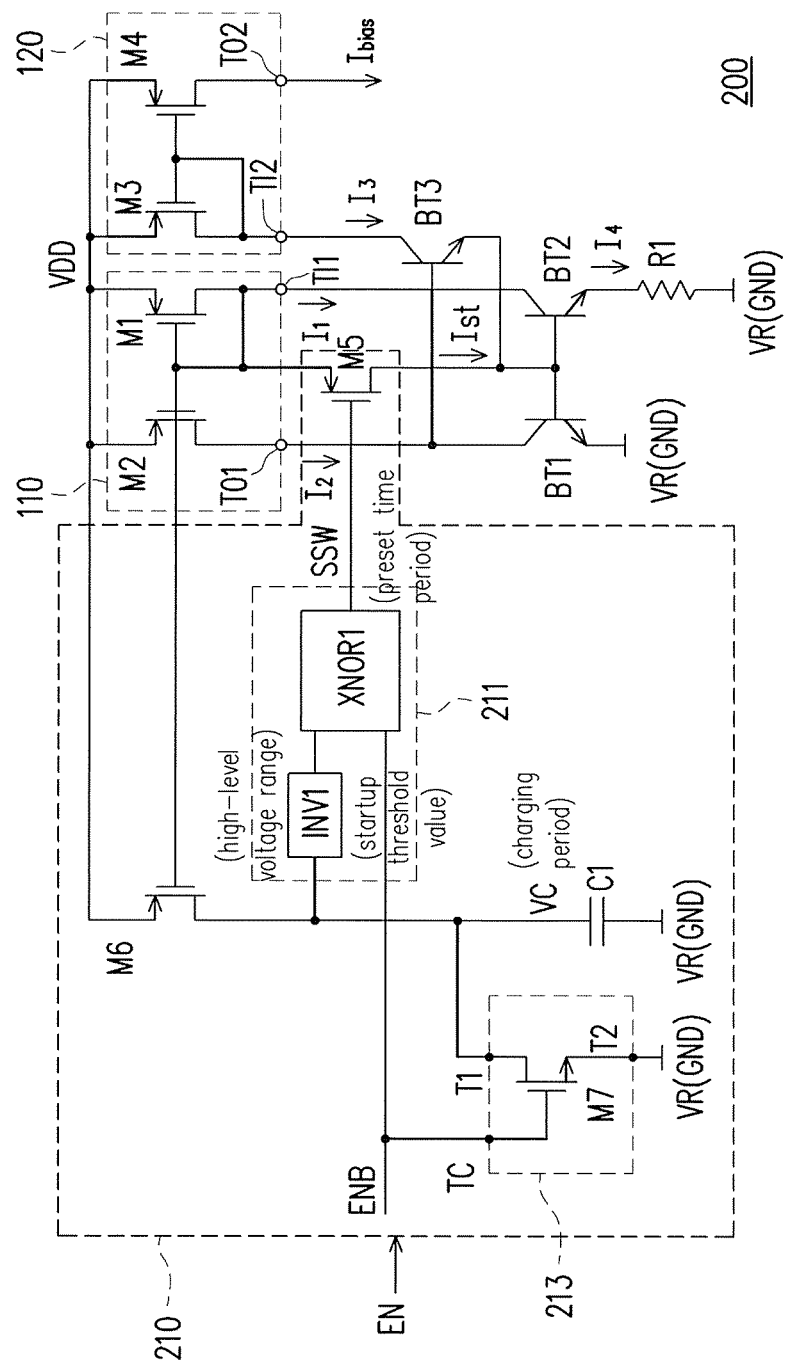
FIG. 2A is a schematic circuit diagram of a current source circuit according to another embodiment of the invention.

FIG. 2A is a schematic circuit diagram of a current source circuit according to another embodiment of the invention. Referring to FIG. 2A and FIG. 1A, a current source circuit 200 is roughly the same as the current source circuit 100, and a difference between them lies in that the current source circuit 200 further includes a startup circuit 210, wherein the same or similar elements are denoted by the same or similar reference numerals. In the present embodiment, the startup circuit 210 is coupled to the first base of the first BJT BT1 and receives a startup signal EN. When the startup signal EN is enabled, a startup current $I_{st}$ is provided to the first base of the first BJT BT1 and the second base of the second BJT BT2 during a preset time period, and the startup current $I_{st}$ is automatically stopped from being provided after the current source has become stable.

In detail, the startup circuit 210 includes a fifth MOS transistor M5, a sixth MOS transistor M6, a first capacitor C1, a control logic circuit 211 and a first switch 213. The fifth MOS transistor M5 has a source (corresponding to a ninth source/drain) coupled to the first input terminal TI1, a fifth gate, and a drain (corresponding to a tenth source/drain) coupled to the first base of the first BJT BT1. The sixth MOS transistor M6 has a source (corresponding to an eleventh source/drain) receiving the system voltage VDD, a sixth gate coupled to the first gate of the first MOS transistor M1 of the first current mirror 110, and a drain (corresponding to a twelfth source/drain).

The first capacitor C1 is coupled between the drain of the sixth MOS transistor M6 and the reference voltage VR, so as to provide a capacitance voltage VC. The control logic circuit 211 is coupled to the first capacitor C1 so as to provide the capacitance voltage VC, and is coupled to the fifth gate of the fifth MOS transistor M5 so as to provide a switch signal SSW to the fifth gate of the fifth MOS transistor M5, wherein when the capacitance voltage VC is less than a startup threshold value, the control logic circuit 211 enables the switch signal SSW, and when the capacitance voltage VC is greater than or equal to the startup threshold value, the control logic circuit 211 disables the switch signal SSW. The first switch 213 has a first terminal T1 coupled to the first capacitor C1, a control terminal TC receiving the startup signal EN, and a second terminal T2 receiving the reference voltage VR. The startup threshold value is, for example, 1/2VDD.

In the present embodiment, the control logic circuit 211 includes an inverter INV1 and an exclusive NOR (XNOR) gate XNOR1. An input terminal of the inverter INV1 receives the capacitance voltage VC. An input terminal of the XNOR gate XNOR1 is coupled to an output terminal of the inverter INV1 and receives an inversion signal ENB of the startup signal EN. An output terminal of the XNOR gate XNOR1 provides the switch signal SSW. The inversion signal ENB may be provided by a circuit outside the current source circuit 200 or may be generated by an inversion circuit or an inverter disposed within the current source circuit 200, which depends on circuit design, and the embodiments of the invention is not limited thereto.

In the present embodiment, the first switch 213 includes a seventh MOS transistor M7. The seventh MOS transistor M7 has a drain (corresponding to a thirteenth source/drain) coupled to the first capacitor C1, a seventh gate receiving the inversion signal ENB of the startup signal EN, and a drain (corresponding to a fourteenth source/drain) receiving the reference voltage VR.

Based on the above, the preset time period of the startup circuit 210 is equal to a charging period during which the capacitance voltage VC increases from the reference voltage VR to within a high-level voltage range (e.g., 1/2VDD or more). That is, the preset time period of the startup circuit 210 is directly proportional to a capacitance value of the first capacitor C1 and is inversely proportional to the current value of the first current $I_1$.

In detail, before the startup signal EN is enabled, i.e., while the startup signal EN is disabled, the startup signal EN is, for example, at a low voltage level and the inversion signal ENB is at a high voltage level. At this moment, the seventh MOS transistor M7 is in a conducted state so that the capacitance voltage VC is 0 (regarded as a low voltage level). Moreover, the inverter INV1 outputs a high voltage level, and the XNOR gate XNOR1 outputs the switch signal SSW having a high voltage level, so as to switch off the fifth MOS transistor M5.

When the startup signal EN is enabled, the startup signal EN is, for example, at a high voltage level and the inversion signal ENB is at a low voltage level. At this moment, the seventh MOS transistor M7 is in a cut-off state, and a current of the drain of the sixth MOS transistor M6 charges the first capacitor C1 so that the capacitance voltage VC increases, wherein the current of the drain of the sixth MOS transistor M6 mirrors the first current $I_1$.

Before the capacitance voltage VC increases and reaches the high-level voltage range, the capacitance voltage VC is regarded as being at a low voltage level. At this moment, the inverter INV1 outputs a high voltage level, and the XNOR gate XNOR1 outputs the switch signal SSW having a low voltage level, so as to conduct the fifth MOS transistor M5. When the fifth MOS transistor M5 is conducted, a part of a current of the drain of the first MOS transistor M1 flows to the first base of the first BJT BT1 and the second base of the second BJT BT2, so that a current of the third emitter of the third BJT BT3 rapidly increases.

When the capacitance voltage VC increases and reaches the high-level voltage range, the capacitance voltage VC is regarded as being at a high voltage level. At this moment, the inverter INV1 outputs a low voltage level, and the XNOR gate XNOR1 outputs the switch signal SSW having a high voltage level, so as to cut off the fifth MOS transistor M5.

Figure 2B:
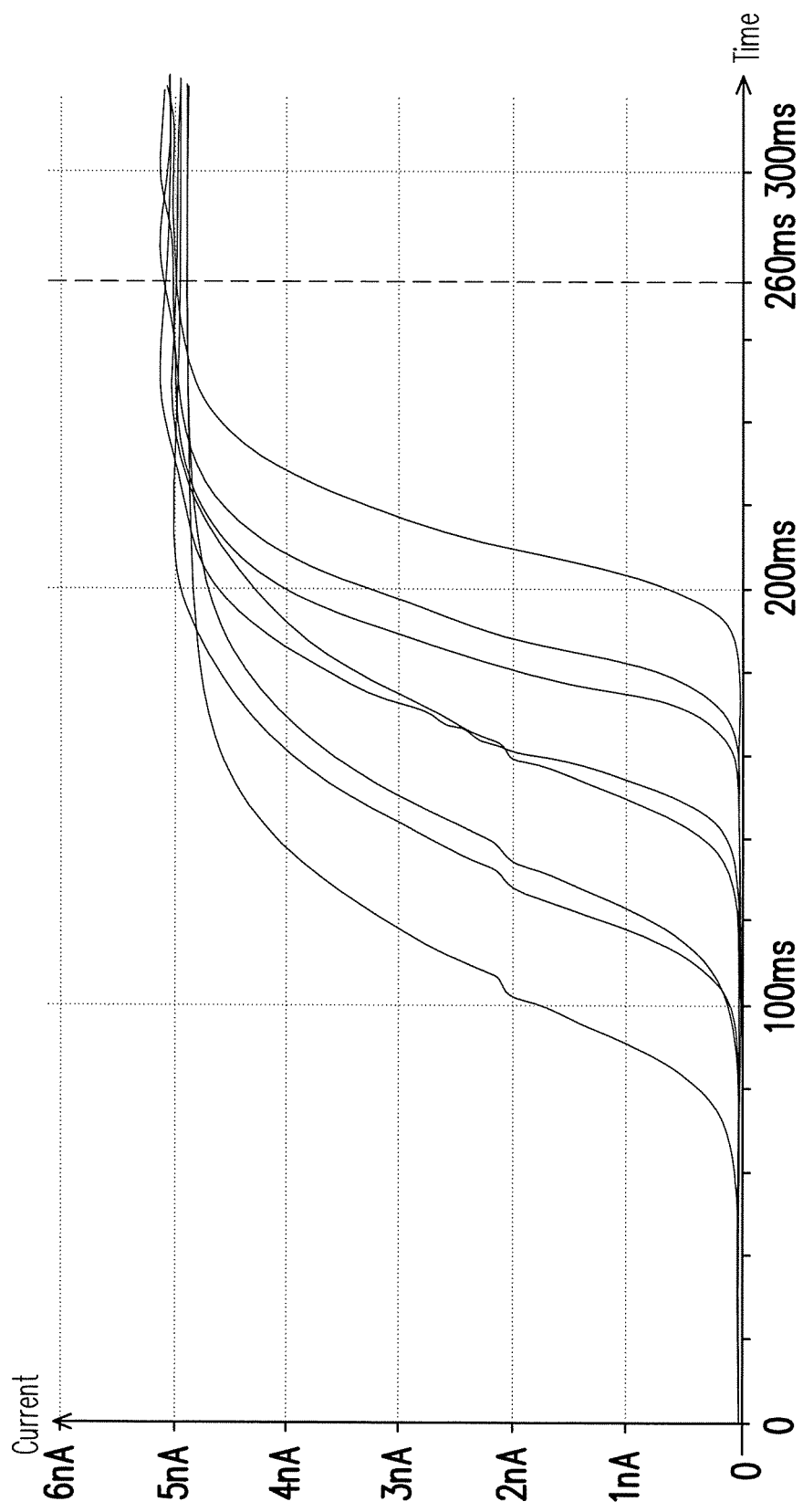
FIG. 2B is a schematic curve diagram of bias current relative to working time under different process variables and temperatures according to an embodiment of the invention.
Figure 2C:
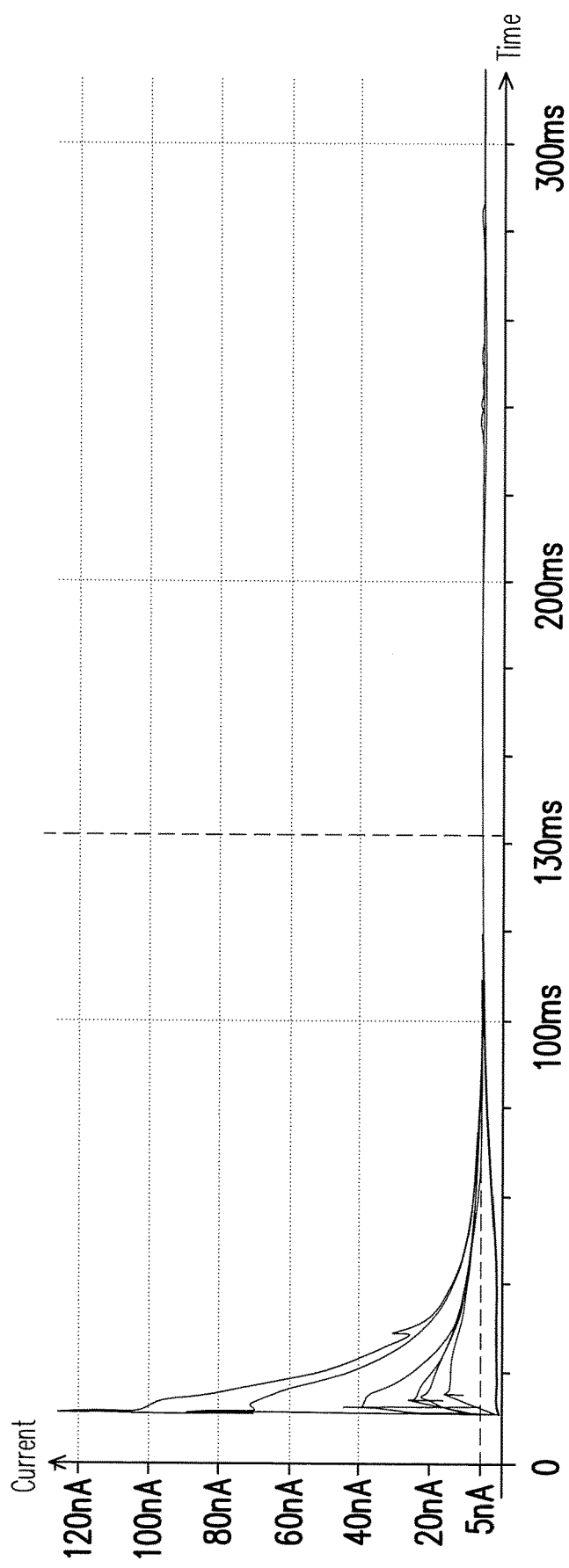
FIG. 2C is a schematic curve diagram of bias current relative to working time under different process variables and temperatures according to another embodiment of the invention.

FIG. 2B is a schematic curve diagram of bias current relative to working time under different process variables and temperatures according to an embodiment of the invention. FIG. 2C is a schematic curve diagram of bias current relative to working time under different process variables and temperatures according to another embodiment of the invention. Referring to FIG. 1A and FIG. 2A to FIG. 2C, when a current source circuit includes no startup circuit (e.g., in the case of the current source circuit 100), the currents of the first BJT BT1, the second BJT BT2 and the third BJT BT3 of the current source circuit 100 gradually increase by means of a gain loop. In detail, after a current of the third base of the third BJT BT3 is gained, the current of the third emitter of the third BJT BT3 is generated. The current of the third emitter of the third BJT BT3 is equal to the current of the first base of the first BJT BT1 and the current of the second base of the second BJT BT2, so that a current (roughly equal to the first current $I_1$) of the second emitter of the second BJT BT2 increases, and the second current $I_2$ thus increases.

In the same process, in the gain loop formed in the current source circuit 100 by the first BJT BT1, the second BJT BT2 and the third BJT BT3, the bias current $I_{bias}$ gradually increases to a target current value (e.g., 5 nA), and the time taken by the current source circuit 100 is approximately 260 ms (milliseconds). In the current source circuit 200, the startup current $I_{st}$ is provided to the first base of the first BJT BT1 and the second base of the second BJT BT2 by the startup circuit 210, which increases the speed at which the bias current $I_{bias}$ increases to the target current value, and the time taken by the current source circuit 200 is approximately 130 ms. That is, the time taken by the current source circuit 200 is approximately half the time taken by the current source circuit 100.

In summary, the current source circuit of the embodiments of the invention mainly includes the first current mirror, the first BJT, the second BJT, the first resistor and the third BJT. Moreover, based on a positive temperature coefficient characteristic of gain values of the BJTs, a current source circuit having temperature compensation is formed. Accordingly, the current source circuit provides the bias current unrelated to temperature. Moreover, the current source circuit of the invention includes a total of only two pins (including one terminal of the first resistor and the first emitter of the first BJT) coupled to the reference voltage (e.g., grounding voltage), and an operating current can therefore be reduced. Moreover, by the startup circuit providing the additional startup current to the bases of the first BJT and the second BJT, an increase in the bias current is accelerated. In addition, in the invention, the startup circuit may be switched off by switching off the fifth MOS transistor. Therefore, the startup circuit is prevented from continuously generating the startup current.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A current source circuit, comprising:
    a first current mirror, having a first input terminal receiving a first current and a first output terminal providing a second current, wherein a current value of the second current is the same as a current value of the first current;
    a first bipolar junction transistor (BJT), having a first collector coupled to the first output terminal, a first base, and a first emitter coupled to a reference voltage;
    a second bipolar junction transistor (BJT), having a second collector coupled to the first input terminal, a second base coupled to the first base, and a second emitter;
    a first resistor, coupled between the second emitter and the reference voltage;
    a third bipolar junction transistor (BJT), having a third collector providing a third current, a third base coupled to the first output terminal, and a third emitter only coupled to the first base and the second base, wherein the third current is configured to set a current value of a bias current of an analog circuit outside the current source circuit; and
    a startup circuit, coupled to the first base and provides a startup current to the first base,
    wherein a speed at which a fourth current flowing through the first resistor increases with temperature is less than a speed at which a gain value of the second BJT increases with the temperature.

2. The current source circuit of claim 1, wherein the first current mirror comprises:
    a first metal oxide semiconductor (MOS) transistor, having a first source/drain receiving a system voltage, a first gate, and a second source/drain coupled to the first gate and the first input terminal; and
    a second metal oxide semiconductor (MOS) transistor, having a third source/drain receiving the system voltage, a second gate coupled to the first gate, and a fourth source/drain coupled to the first output terminal.

3. The current source circuit of claim 1, further comprising:
    a second current minor, having a second input terminal receiving the third current and a second output terminal providing the bias current to the analog circuit.

4. The current source circuit of claim 1, wherein the startup circuit receives a startup signal, wherein when the startup signal is enabled, the startup current is provided to the first base during a preset time period, and the startup current is stopped from being provided after the preset time period has elapsed.

5. The current source circuit of claim 1, wherein VBE1−VBE2=VT1n(n), wherein VBE1 is a voltage difference between the first base and the first emitter, VBE2 is a voltage difference between the second base and the second emitter, VT is a BJT thermal voltage, and n is a positive integer.

6. The current source circuit of claim 1, wherein the reference voltage is a grounding voltage.

7. The current source circuit of claim 3, wherein the second current mirror comprises:
    a third metal oxide semiconductor (MOS) transistor, having a fifth source/drain receiving a system voltage, a third gate, and a sixth source/drain coupled to the third gate and the second input terminal; and
    a fourth metal oxide semiconductor (MOS) transistor, having a seventh source/drain receiving the system voltage, a fourth gate coupled to the third gate, and an eighth source/drain coupled to the second output terminal.

8. The current source circuit of claim 4, wherein the startup circuit comprises:
    a fifth metal oxide semiconductor (MOS) transistor, having a ninth source/drain coupled to the first input terminal, a fifth gate, and a tenth source/drain coupled to the first base;

a sixth metal oxide semiconductor (MOS) transistor, having an eleventh source/drain receiving a system voltage, a sixth gate coupled to the first current mirror, and a twelfth source/drain;

a first capacitor, coupled between the twelfth source/drain and the reference voltage, so as to provide a capacitance voltage;

a control logic circuit, coupled to the first capacitor so as to provide the capacitance voltage, and coupled to the fifth gate so as to provide a switch signal to the fifth gate, wherein when the capacitance voltage is less than a startup threshold value, the switch signal is enabled, and when the capacitance voltage is greater than or equal to the startup threshold value, the switch signal is disabled; and a first switch, having a first terminal coupled to the first capacitor, a control terminal receiving the startup signal, and a second terminal receiving the reference voltage.

9. The current source circuit of claim 8, wherein the control logic circuit comprises:

an inverter, wherein an input terminal of the inverter receives the capacitance voltage; and an exclusive NOR (XNOR) gate, wherein an input terminal of the XNOR gate is coupled to an output terminal of the inverter and receives an inversion signal of the startup signal, and an output terminal of the XNOR gate provides the switch signal.

10. The current source circuit of claim 8, wherein the first switch comprises:

a seventh metal oxide semiconductor (MOS) transistor, having a thirteenth source/drain coupled to the first capacitor, a seventh gate receiving an inversion signal of the startup signal, and a fourteenth source/drain receiving the reference voltage.

11. The current source circuit of claim 8, wherein the preset time period is directly proportional to a capacitance value of the first capacitor and is inversely proportional to the current value of the first current.

12. The current source circuit of claim 9, wherein the preset time period is equal to a charging period during which the capacitance voltage increases from the reference voltage to within a high-level voltage range.

* * * * *